United States Patent
Koshikawa et al.

(10) Patent No.: US 7,085,187 B2
(45) Date of Patent: Aug. 1, 2006

(54) SEMICONDUCTOR STORAGE DEVICE

(75) Inventors: Yasuji Koshikawa, Tokyo (JP); Chiaki Dono, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 48 days.

(21) Appl. No.: 10/995,465

(22) Filed: Nov. 24, 2004

(65) Prior Publication Data
US 2005/0117411 A1 Jun. 2, 2005

(30) Foreign Application Priority Data
Nov. 28, 2003 (JP) ............................. 2003-398444

(51) Int. Cl.
*G11C 5/14* (2006.01)
(52) U.S. Cl. .................. 365/229; 365/228; 365/185.25
(58) Field of Classification Search ................ 365/229, 365/228, 185.25
See application file for complete search history.

(56) References Cited

U.S. PATENT DOCUMENTS

| | | |
|---|---|---|
| 5,499,211 A | 3/1996 | Kirihata et al. |
| 6,418,075 B1 * | 7/2002 | Shimano et al. ............. 365/227 |
| 6,426,908 B1 * | 7/2002 | Hidaka ........................ 365/222 |

FOREIGN PATENT DOCUMENTS

| | | |
|---|---|---|
| JP | 8-263983 | 10/1996 |
| JP | 11-126498 | 5/1999 |
| JP | 2001-184868 | 7/2001 |
| JP | 2003-36676 | 2/2003 |

* cited by examiner

*Primary Examiner*—Tuan T. Nguyen
(74) *Attorney, Agent, or Firm*—McGinn IP Law Group, PLLC

(57) ABSTRACT

A semiconductor storage device in which the chip area is prevented from increasing to reduce the leakage current during low power (power down) time caused by shorting across bit and word lines due to crossing failure. There are provided precharge equalizing NMOS transistors the gates of which are supplied with a control signal (BLEQT). These precharge equalizing NMOS transistors are connected across a power supply line (VNLR), supplying a precharge potential to the bit line, and the bit line. At the time of low power operation, a potential (0.7 to 1.4V) lower than the potential VPP (e.g. 3.2V) applied during the precharge operation of the normal operation is supplied to the gate terminals of the transistors to reduce the leakage current caused by shorting across the bit and word lines caused in turn by crossing failure.

18 Claims, 11 Drawing Sheets

(EMBODIMENT 1 NMOS)

(EMBODIMENT 2 PMOS)

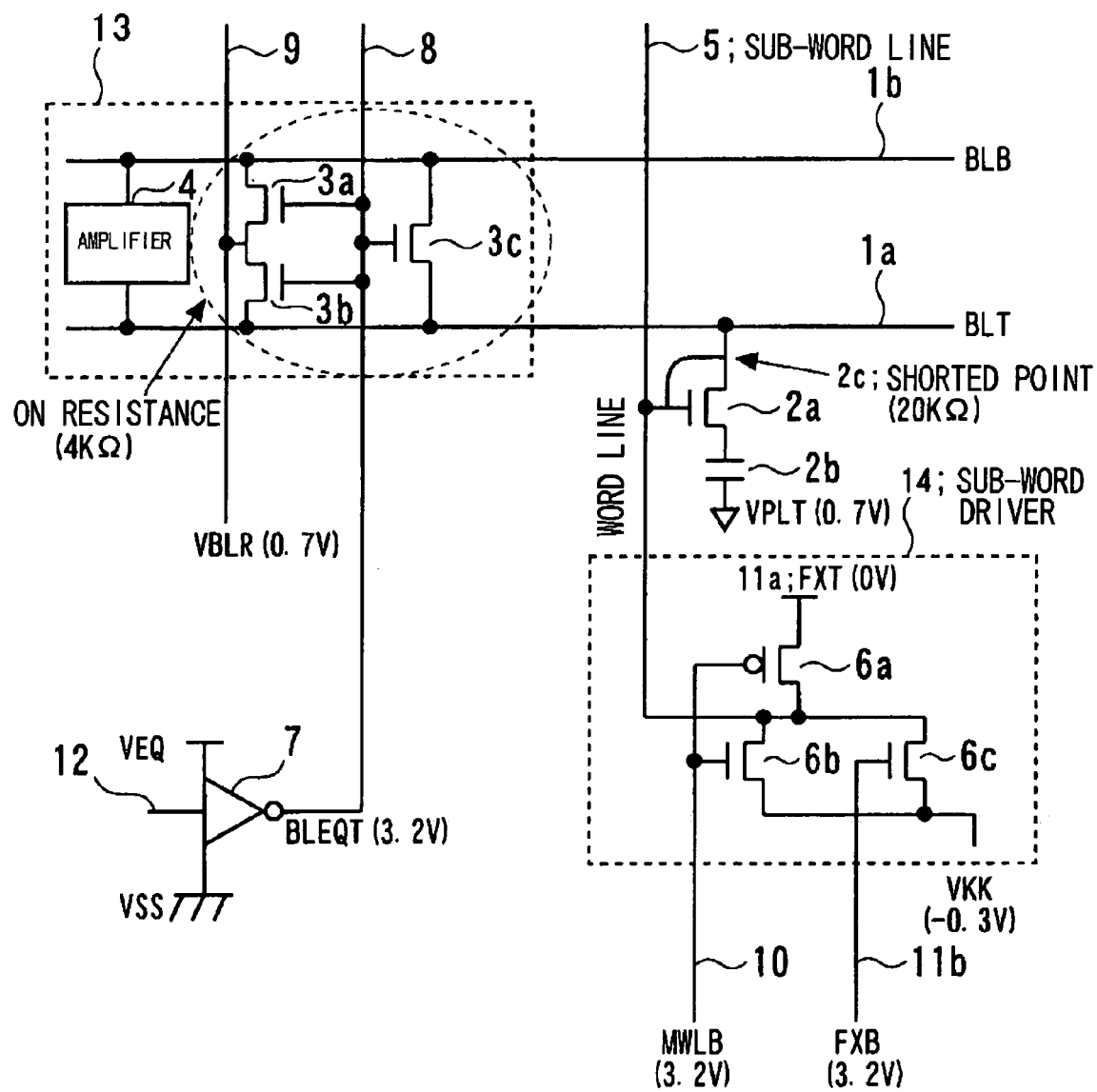
FIG. 10 COMPARATIVE EXAMPLE

SEMICONDUCTOR STORAGE DEVICE

FIELD OF THE INVENTION

This invention relates to a semiconductor device and, more particularly, to a semiconductor device convenient in reducing the leakage current across bit and word lines ascribable e.g. to crossing failure.

BACKGROUND OF THE INVENTION

With the progress of the miniaturization of semiconductor devices, the leakage current caused by shorting across bit and word lines ascribable e.g. to crossing failure is becoming non-negligible. In a semiconductor storage device of these days, a redundancy circuit for remedying a malfunctioning cell is provided, such that a fail cell, suffering from crossing failure, can be replaced by a redundant cell. However, even if such a fail cell is relieved by the redundant cell, a current path produced by shorting across the bit and word lines is left unremedied, so that power dissipation ascribable to the leakage current poses a problem. In particular, in a low power type semiconductor storage device, having the low power operation mode, also termed a power-down or standby mode, such leakage current leads to increased standby current.

Up to now, various proposals have been made as a countermeasure against crossing failure caused by the leakage current across the bit and word lines. As a representative technique for reducing the leakage current, caused by shorting across the bit and word lines, there is known a configuration in which a high-resistance transistor (transistor having a long channel length), a diode or a high-resistance conductor is inserted across a bit line precharge potential and the bit lines, by way of limiting the current.

A few of publications of the relevant art are now explained. As typical of the semiconductor storage device, designed to reduce the leakage current across the bit and word lines, ascribable to crossing failure, the configuration shown for example in FIG. 11 has been proposed (see Patent Document 1, indicated hereinbelow). Referring to FIG. 11, a bit line precharge current limiter PT1 is provided in a bit line precharge equalizing circuit 214 in order to minimize the current flow on occurrence of crossing failure, by way of limiting the bit line current. In FIG. 11, transistors TN2 and TN3, each having a gate connected to a precharge equalizing line PEQ, represent a circuit for precharging bit lines BL and /BL, connected to the sources of the transistors, to a precharge potential. An over-bar on BL in the drawing is depicted herein by a slash mark (/). The drains of the transistors are connected in common and connected via transistor TN4 to an output of a precharge power supply circuit 210. A transistor TN1, having a gate connected to PEQ, is an equalizing circuit for balancing the bit lines BL and /BL.

There is also known a DRAM in which a bit line precharging circuit is provided with an active current limiter for selectively limiting the amount of the precharge current, under control by the ternary-valued voltage supplied from the column selection line, and in which the current path during the chip standby time may be interrupted even on occurrence of shorting across the bit and word lines (see Patent Document 2, indicated hereinbelow). This Patent Document 2 discloses such a configuration in which a precharge transistor is connected to a precharge potential equal to ½ VCC via a depletion NMOS transistor, and in which a negative voltage is supplied from an associated column selection line to the gate of the depletion type NMOS transistor to interrupt the current path.

There is also known a configuration of a semiconductor storage device in which the standby current is not increased by a bit line having a path for the leakage current, with the bit line not being in the floating state during the standby period. In this configuration, there is provided a potential setting means connected to each bit line for fixing the potential of the bit line to the potential of the destination of the path for the leakage current. For a normal sub-array, the totality of the bit lines of the sub-array is pre-charged to a preset potential by a precharging means. For a sub-array having a path for the leakage current, precharging is not carried out during the standby period by the precharging means, with the potential setting means being in the operative state. The potential setting means is formed by a dummy memory cell for setting a potential at a bit line holding potential (see for example the Patent Document 3, indicated hereinbelow).

There is also known a configuration in which, in transferring to the standby (power-down) state, responsive to a chip select signal, the bit line is transiently set to a floating state, the potential on the bit line at such time is held in a latch circuit, it is then determined, in dependence upon the potential, whether or not the bit line is to be coupled to the power supply potential, and in which the bit line is disconnected from the power supply potential on occurrence of a minor shorting on the bit line to decrease the standby current (for example, see the Patent Document 4, indicated below).

Patent Document 1

Japanese Patent Kokai Publication No. JP-A-8-263983 (page 3, FIG. 3)

Patent Document 2

Japanese Patent Kokai Publication No. JP-A-11-126498 (page 4, FIG. 1)

Patent Document 3

Japanese Patent Kokai Publication No. JP-A-2001-184868 (pages 7 to 8, FIG. 2)

Patent Document 4

Japanese Patent Kokai Publication No. JP-A-2003-36676 (page 9, FIG. 2)

SUMMARY OF THE DISCLOSURE

In the above-described conventional semiconductor storage device, a bit line precharge current limiter (see FIG. 11), for example, is provided, thus increasing the area of the sense amplifier.

Moreover, during normal operation, other than the power down time, the time needed to precharge the bit line to the precharge potential is increased, thus lowering the speed of the sense amplifier operation. The same may be said of the configuration of inserting a high-resistance transistor or a high-resistance conductor.

Accordingly, it is an object of the present invention to provide a semiconductor storage device in which the leakage current across a bit line and a word line may be reduced as the increase in the chip area is suppressed.

It is another object of the present invention to provide a semiconductor storage device in which, as the above object is accomplished, the operating speed of the sense amplifier may be prevented from being lowered during the normal operation time other than the low power time.

The above and other objects are attained by the present invention, which performs control so as to vary the potential, applied to a control terminal of at least one active element which supplies the precharge voltage to the bit lines, between at the time of the normal operation and at the time of low power (power down) operation.

A semiconductor storage device in accordance with one aspect of the present invention, comprises:

a memory cell array including a plurality of bit lines, extending in one direction, a plurality of word lines, extending in a direction perpendicular to said bit lines, and a plurality of memory cells arranged at points of intersection of said bit lines ands said word lines;

an active element inserted across a precharge power supply line for supplying the precharging potential to said bit line and said bit line, said active element precharging said bit line responsive to a control signal supplied to a control terminal thereof; and a circuit for performing control so as to supply to said control terminal of said active element at the time of low power operation a preset voltage changed from the voltage applied to said control terminal at the time of precharging in normal operation; whereby the leakage current caused by shorting across said bit line and the word line is limited at the time of low power operation.

The semiconductor storage device according to the present invention may further comprise a circuit for generating a signal controlling the setting/release of the low power based on at least one signal entered to an external terminal of the semiconductor storage device, and a circuit for performing switching control for supplying the preset potential different from the potential applied to the control terminal at the time of precharging in normal operation.

According to the present invention, the active element is a transistor of a first conductivity type. At the time of low power operation, the control terminal of the transistor is set to a potential lower than a first potential applied to the control terminal at the time of precharging in normal operation. At the time of low power operation, the preset potential as set on the control terminal of the transistor is set so as to be not larger than one-half of the first potential. At the time of low power operation, the preset potential as set on the control terminal of the transistor is set so as to be not less than the precharge potential (one-half the high level potential VDL of the bit line, termed '½ VCC').

The semiconductor storage device according to the present invention may further comprise a first power supply control circuit including a voltage follower amplifier circuit activated at the time of low power operation, having an output set to be in an off state except at the time of low power operation, having a non-inverting input end supplied with the preset potential and having an output end thereof connected in feedback fashion to an inverting input end thereof, and a second power supply control circuit activated except at the time of low power operation to output the first potential. The second power supply control circuit has an output turned off at the time of low power operation. The output ends of the first and second power supply control circuits are connected in common. The common junction of the output ends may be connected to a power feed terminal of a high side power supply of the driver circuit.

According to the present invention, the time until the high side power supply potential of the driver circuit resets from the preset potential to the first potential, in case of restoration, with the low power state released, is set so as to be shorter than the time until the high side power supply potential of the driver circuit undergoes transition from the first potential to the preset voltage for low power setting.

The meritorious effects of the present invention are summarized as follows.

According to the present invention, the potential of the control terminal of the active element during the low power operation is varied from that during the precharge operation of the normal operation to reduce the on-current of the active element (to increase the on-resistance) to diminish the leakage current across the bit and word lines and, during the precharge operation, other than the low power operation, a sufficient amount of the on-current by the active element is maintained to suppress the lowering of the operating speed of the sense amplifier.

Moreover, according to the present invention, the current flowing through an existing precharge equalizing element is variably controlled to reduce the leakage current to prevent the chip area from increasing without the necessity of providing a current limiting element.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 10 illustrates a comparative example.

PREFERRED EMBODIMENTS OF THE INVENTION

For further detailed description of the present invention, reference is made to the accompanying drawings. The semiconductor storage device, according to a preferred embodiment of the present invention, is configured to control the potential at the control terminal of a transistor, forming a precharge equalizing circuit, supplying the precharge potential to the bit line, during the low power (power-down) operation, is controlled to supply a preset potential, varied from the potential applied to the control terminal during the precharging of the normal operation (e.g. a high potential VPP). According to the present invention, the on-current on the transistor control terminal is reduced by reducing the current supplied to the bit line to reduce the leakage current across the bit and word lines. During the normal operation, other than the low power operation, the potential sufficient to turn on the transistor is supplied to the control terminal of the transistor forming the precharge equalizing circuit, thereby preventing the operating speed of the sense amplifier from being lowered to realize a high operating speed.

In an embodiment of the present invention, no new current limiting element need to be provided in the precharge equalizing circuit, for reducing the leakage current, as in the above-described conventional circuit, thereby suppressing the increase in the chip area.

Figure 1:
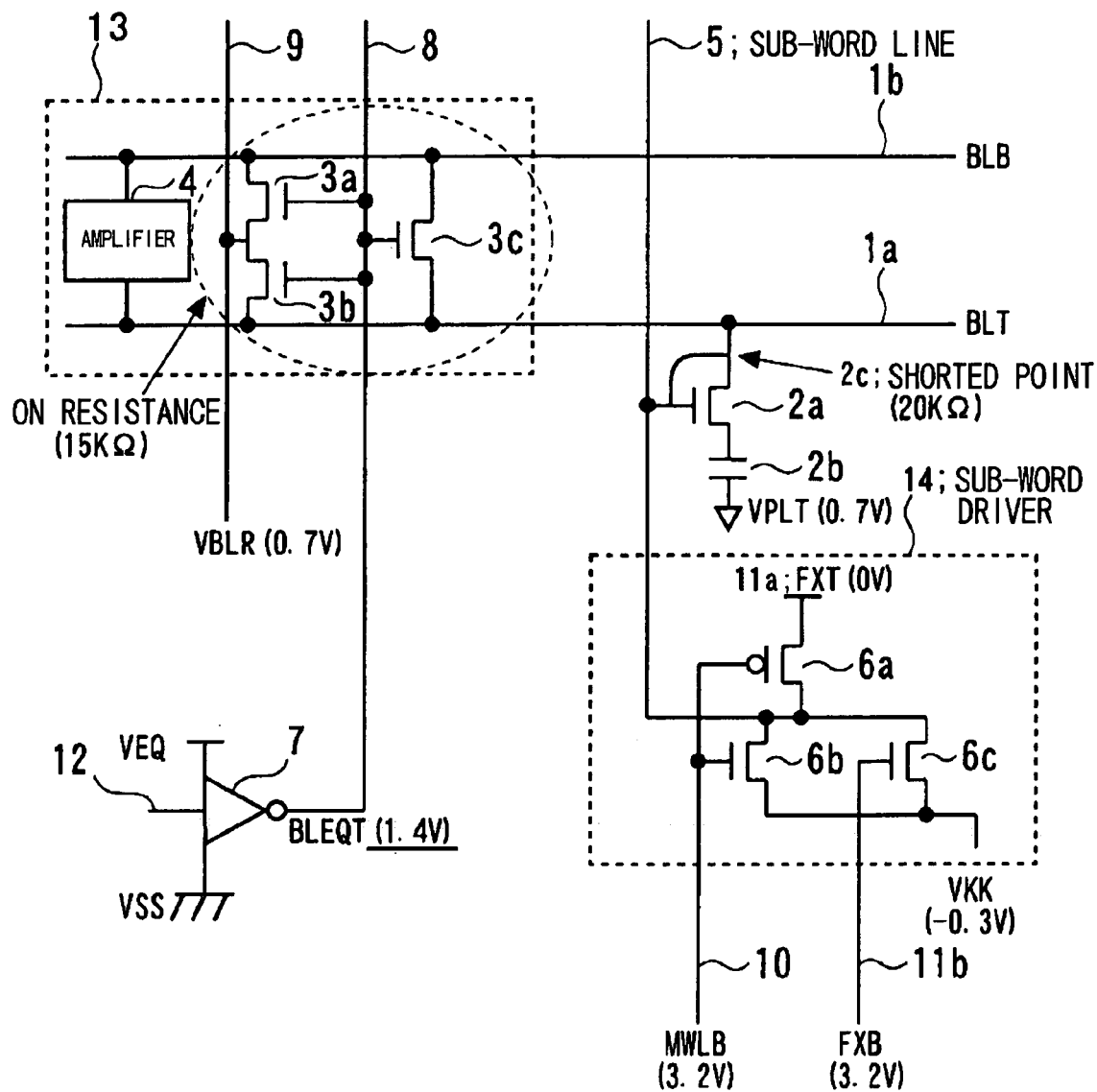
FIG. 1 shows a configuration of an embodiment of the present invention.

FIG. 1 shows the configuration of an embodiment of the present invention. FIG. 1 shows an embodiment of the present invention in which the invention is applied to a semiconductor storage device including a dynamic memory cell in need of a refresh operation for data retention. More specifically, there are shown a sense amplifier unit 13, forming a bit line based circuit of the dynamic semiconductor storage device, a driver circuit 7 for driving a precharge equalizing control signal line 8, and a sub-word driver 14 for driving a sub-word line 5. There is also shown shorting 2c across bit and word lines on the occasion of the low power (power-down).

A memory cell array of a hierarchical word line structure, shown only partially in FIG. 1, is now explained in its entirety. A semiconductor chip is divided to form plural memory blocks or bank not shown. The blocks, thus formed, are of a similar configuration, in which an X decoder, not shown, is provided for extending along an end of a memory array for decoding row addresses, and a Y-decoder, also not shown, is provided for extending at right angles thereto. A memory array part of a memory block includes a plural number of memory arrays obtained on division along a word line extending in one direction from the X-decoder. Each memory array has sub-word lines. The sub-word lines of the memory arrays are selected by a main sub-word line and a sub-word selection line, arranged for traversing plural memory arrays, in accordance with a hierarchical word line system. This reduces the number of memory cells, connected to the sub-word line, thus speeding up the sub-word line selecting operation. Each memory cell array includes a plurality of sub-word lines extending in one direction, a plurality of bit lines extending at right angles to the one direction, and a plurality of dynamic memory cells arranged at points of intersection of the bit and word lines. In the example of FIG. 1, each memory cell includes a cell transistor 2a and a capacitor element 2b for storage, per cell, and is associated with the information of 1 and 0 specifying whether or not there is an electrical charge in the capacitor element 2b. The read operation takes place based on charge coupling of the electric charge on the capacitor element 2b and the precharge electric charge on the bit line. The gate, drain and the source of the cell transistor 2a are connected to the word line (sub-word line) 5, an associated bit line 1a and to one end of the capacitor element 2b, respectively, with the other end of the capacitor element 2b being connected to a plate line VPLT with a potential e.g. of 0.7V.

Referring to FIG. 1, there are provided NMOS transistors 3a and 3b, having sources connected to paired bit lines 1a and 1b, having drains connected in common, and having a common junction point connected to a power supply line (VBLR) 9, which is connected to a precharge power supply line, not shown, to give a precharge potential. The gates of the NMOS transistors 3a and 3b are connected in common to a precharge equalizing control signal line (BLEQT) 8. There is also provided an equalizing NMOS transistor 3c, having one of the source and the drain connected to the bit line 1a, having the other of the source and the drain connected to the bit line 1b and having the gate connected to the precharge equalizing control signal line (BLEQT) 8.

The precharge equalizing control signal line (BLEQT) 8 is connected to an output end of a driver circuit (driver) 7. The high-side driving power supply potential of the driver 7 is the potential VEQ. When the input signal (digital signal) 12 is activated, the precharge equalizing control signal line 8 is driven to the potential VEQ and, when the input signal is inactivated, the precharge equalizing control signal line 8 is driven to the low-side power supply potential (ground potential) VSS. The driver 7 is made up e.g. by a CMOS inverter. That is, the driver includes a PMOS transistor, not shown, having a source connected to the high-side power supply potential VEQ, and an NMOS transistor, also not shown, having a source connected to the low-side power supply potential VSS. The NMOS transistor and the PMOS transistor have drains connected in common and connected to the precharge equalizing control signal line 8, while having gates connected in common and connected to the input signal 12. This input signal 12 is activated by a precharge control signal generated by a precharge (PRE) command following the access by an active (ACT) command.

In FIG. 1, a sense amplifier (amplifier circuit) 4 and precharge equalizing circuits 3a to 3c are indicated as a sense amplifier unit 13. This sense amplifier unit 13 is provided from one bit line pair to another. The amplifier circuit 4 of the sense amplifier unit 13 is of a known circuit structure and operates for amplifying the potential on the bit line pair and for outputting readout data to an input/output line via a selected Y-switch, not shown, during readout, for amplifying write data supplied from an input/output line, not shown, via selected Y-switch, not shown, and for driving the bit line, during writing, and for amplifying the bit line potential for restoring the so amplified potential in the memory cell, during the refresh operation. It is of course possible to provide a precharge equalizing circuit and a bit line pair on the left side of the sense amplifier 4, with the sense amplifier 4 as center, in left-and right symmetry, in a manner not shown, so that the sense amplifier 4 is used in common across bit line pairs of the two memory arrays.

The sub-word driver 14 includes a PMOS transistor 6a, having a source and a gate connected to a sub-word line selecting line FXT and to a main word line (MWLB) 10, respectively, an NMOS transistor 6b, having a drain and a gate connected to the drain of the PMOS transistor 6a and to the main word line (MWLB) 10, respectively, and an NMOS transistor 6c, having a drain and a gate connected to the drain of the PMOS transistor 6a and to a sub-word line selecting line (FXB, a complementary signal of FXT) 11b, respectively. The common connection node of the drains of the PMOS transistor 6a and the NMOS transistors 6b and 6c is connected to the sub-word line 5. The sources of the NMOS transistors 6b and 6c are connected in common and connected to a word line resetting potential VKK (=−0.3V).

FIG. 1 shows an example in which the power is low power (power down), the sub-word driver 14 is in an inactivated state, and the sub-word line 5 is in the resetting potential VKK (=−0.3V). In the low power state, the main word line (MWLB) is in the high level, so that the PMOS transistor 6a is off, while the NMOS transistor 6b is on. The sub-word line selecting line (FXT) 11a is inactivated and is at a ground potential (0V), with the complementary sub-word line selecting line (FXB) 11b being at a high level (a raised voltage of 3.2V). The NMOS transistor 6c is in the on-state. Hence, the sub-word line 5 is at the same potential as the resetting potential (=−0.3V). On the other hand, when the sub-word driver 14 is in an activated state, during the normal operation, FXT is in the high-side power supply potential VPP, whilst FXB is in the low-side power supply voltage VSS. The main word line MWLB is at the low level, whilst the selected sub-word line 5 is driven to the high potential VPP.

At the time of low power operation, the potential of the power supply line (VBLR) 9 is ½ times the high level potential VDL of the bit line (1.4V), or 0.7V.

In the present embodiment, the potential of the precharge equalizing control signal line (BLEQT) 8, also termed the 'equalized potential', is 1.4V. The setting of the equalized potential at the time of low power operation is one of the features of the present invention.

The leakage current is generated when the crossing failure has occurred on a bit line such that the bit and word lines are subjected to shorting. However, in the present embodiment, the equalized potential VEQ, supplied to the gates of the transistors 3a to 3c of the precharge equalizing circuit at the time of low power operation is not the high voltage (boosted voltage) VPP=3.2V, but is an intermediate potential of 1.4V which is lower than VPP.

At this time, the gate-to-source potential VGS of each of the NMOS transistors 3a to 3c is 0.7V. The NMOS transistors 3a to 3c are all in the on-state and the channel current (drain current IDS) flows across the drain and the source.

If it is assumed that
the potential VKK of a non-selected word line is −0.3V,
the precharge potential VBLR is 0.7V,
the equalized potential VEQ is 1.4V,
the on-resistance of the transistors of the precharge equalizing circuits 3a to 3c (on-resistance of the NMOS transistor 3b in FIG. 1) is 15 kΩ, and
the equivalent resistance of a shorted part 2c of the bit line 1a and the sub-word line 5 is 20 kΩ, the leakage current flowing from the precharge potential VBLR→transistor 3b→bit line 1a→shorted part 2c→sub-word line 5→parallel connected on-state transistors 6b, 6c→resetting power supply potential VKK is approximately 25 μA.

FIG. 10 shows, by way of a comparative example, a configuration in which the equalized potential (VEQ) is not lowered even during the lower power time. At the time of low power operation, the potential on the precharge equalized control signal line 8 is 3.2V. For other cases of setting, the configuration is similar to that shown in FIG. 1.

If it is assumed that
the precharge potential VBLR is 0.7V,
the equalized potential VEQ is 3.2V,
the on-resistance of the transistors of the precharge equalizing circuits 3a to 3c (on-resistance of the NMOS transistor 3b in FIG. 10) is 4 kΩ, and
the equivalent resistance of a shorted part 2c of the bit line 1a and the sub-word line 5 (cell transistor) is 20 kΩ, the leakage current flowing from VBLR→transistor 3b→bit line 1a→shorted part 2c→sub-word line 5→parallel connected on-state transistors 6b, 6c→resetting power supply potential VKK is approximately 42 μA. That is, the gate-to-source potential VGS of the NMOS transistors 3a, 3b, to the gate of which 3.2V is applied, is 2.5V, and the on-resistance of the NMOS transistor 3b is 4 kΩ, which is lower than in the example shown in FIG. 1. The leakage current flowing from the precharge potential VBLR through the precharge equalizing circuit, bit line and the sub-word line to the resetting power supply is larger than in the embodiment shown in FIG. 1.

As may be apparent from comparison of FIGS. 1 and 10, the leakage current in the present embodiment may be lowered by (42/25)=17/42=0.404, that is, by as much as 40%, as compared to that in the comparative example, without increasing the chip area of the cell array (precharge equalizing circuit).

In the present embodiment, the bit line pair 1a and 1b is precharge equalized to 0.7V, without being in the floating state.

In FIG. 1, such a case has been explained in which the shorting across the bit and word lines has occurred at a sole location by the crossing failure. It is, however, apparent that the leakage current reducing effect may be achieved in similar manner in case crossing failure has occurred at plural locations along a sole bit line. The leakage current reducing effect may be similarly achieved in case crossing failure has occurred in plural bit lines crossing a sole sub-word line.

Figure 2:
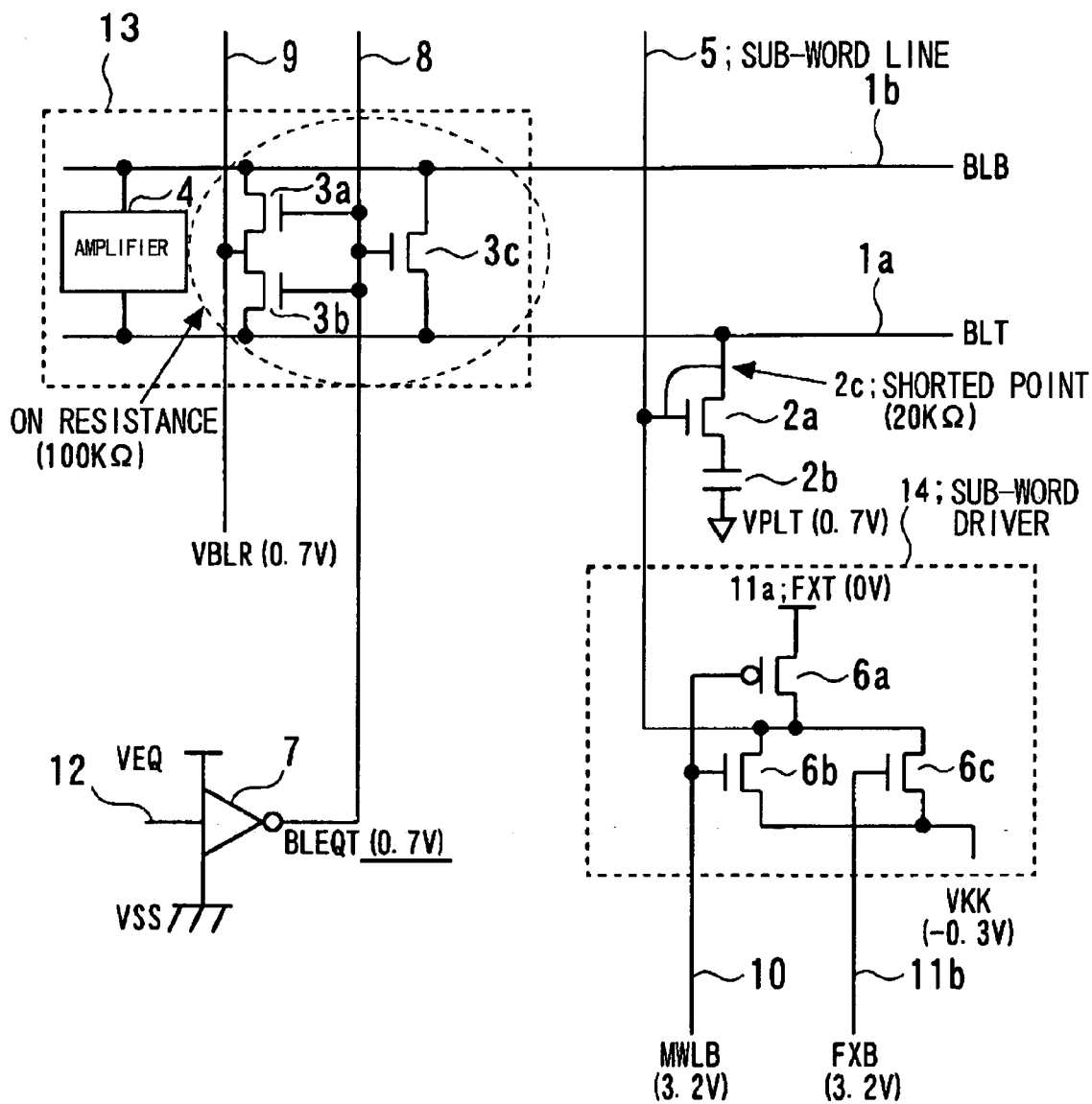
FIG. 2 shows a modification of the embodiment.

FIG. 2 shows a modification example of the embodiment shown in FIG. 1. This modification is similar in its basic configuration to the embodiment shown in FIG. 1. The point of difference of the present modification from the embodiment shown in FIG. 1 is that the potential on the precharge equalizing control signal line 8 during the low power (power down) time is 0.7V (precharge potential on the bit line=one-half the high level potential VDL on the bit line). Hence, the power supply voltage supplied to the high-side power supply VEQ of the driver 7 also differs from that in the configuration shown in FIG. 1. In this case, the gate potential of the transistor 3b of the precharge equalizing circuit is 0.7V, the on-resistance is 100 kΩ. The leakage current flowing from the precharge power supply line VBLR through the precharge equalizing circuit, bit line 1a, shorted part 2c and the sub-word line 5 to the reset power supply line potential VKK (−0.3V) is approximately 10 μA. That is, the current limiting effect is higher than in the embodiment shown in FIG. 1. However, if the potential on the precharge equalizing control signal line 8 at the time of low power operation is set to 0.7V, the transistor 3b approaches to an off-state, with the precharging capacity of the bit line at the time of low power operation being lowered. Hence, bit line precharge equalizing at the time of restoration to the normal mode following low power mode turn-off is somewhat time-consuming.

On the other hand, in the above-described embodiment, shown in FIG. 1, the precharge equalizing circuits 3a to 3c precharge-equalizes the bit line pair 1a, 1b to ½VDD (0.7V), at the time of low power operation, such that no time is consumed in switching from the low power operation to the normal operation, thus reducing the time for restoration.

Figure 3:
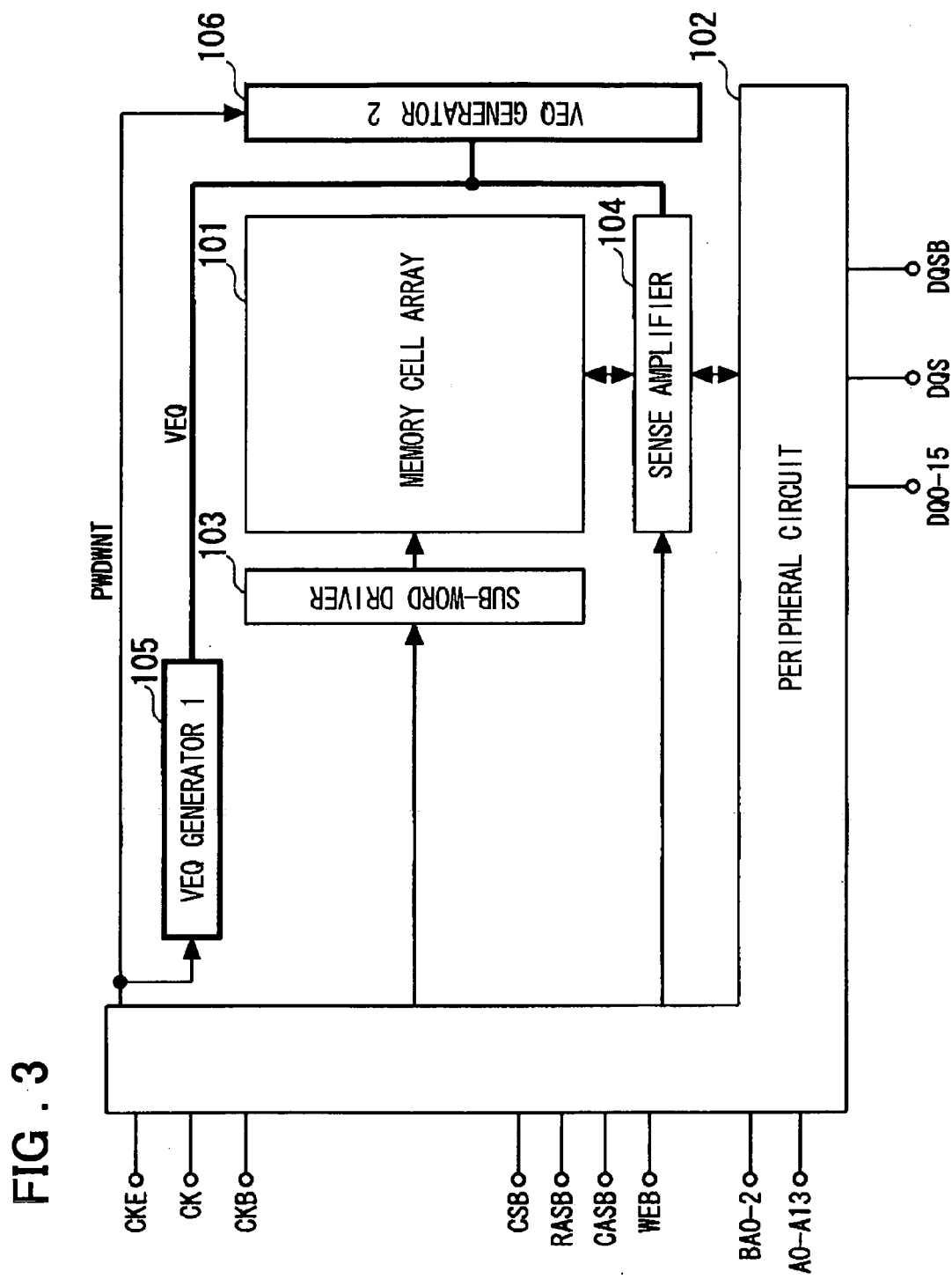
FIG. 3 shows a configuration of an embodiment of a semiconductor storage device according to the present invention.

FIG. 3 shows the configuration of an embodiment of a semiconductor storage device according to the present invention. Referring to FIG. 3, the semiconductor storage device of the present embodiment includes a memory cell array 101, a sub-word driver 103, a sense amplifier 104, a peripheral circuit 102, a first VEQ generator 105 and a second VEQ generator 106.

The input control signals may be enumerated by complementary clock signals CK and CKB, a clock enable signal CKE, a chip select signal CSB (B at the trailing end of the signal name indicating that the low level corresponds to the activated state), a row address strobe signal RASB, a column address strobe signal CASB, and a write enable signal WEB. There are further an address signal input terminal A0–13 (14 bits), a bank address input terminal BA0–2, a data input output terminal DQ0–15 (16 bits) and data strobe terminals DQS and DQSB. The external clock CK and anti-phase clock CKB are clock signal for synchronization. The input signal is synchronized with the rising of the clock signal CK. For DDR SDRAM (double data rate synchronous DRAM), the DQ mask enable DM is excluded from the input signal. The input/output reference is the crossing point of the clock signals CK and CKB. The clock enable signal CKE is a signal determining whether or not the clock signals CK and CKB are valid. For example, if the CKE is high at the rising edge of CK, the clock CK is then validated. If otherwise, the clock is invalidated. If, in the idle state and in the bank active state, the CKE goes low, the low power (power down) state is entered. In the low power mode, the CKE needs to be maintained at a low level. When the chip select signal CSB is at a low level, the command input is validated. At the rising edge of the clock CK, the chip select signal CSB is input, and the signals RASB, CASB and WEB are also entered to determine the operation of the SDRAM. On the other hand, the bank selected differs with the value of the bank address BA0–2 at the time of command input. The data strobe signal DQS is used for controlling the I/O buffer. Data input/output reference is an edge of the data strobe signal DQS.

The sense amplifier 104 includes the amplifier circuit 4 and the precharge equalizing circuits 3a to 3c of FIG. 1.

The memory cell array 101 includes a plural number of bit lines, extending along the up-and-down direction in the drawing, a plural number of word (sub-word) lines, extending along the transverse direction in the drawing, and a plural number of memory cells at the points of intersection of the bit and word lines.

A power down signal PWDWNT is generated based on the clock enable signal CKE. When the power down signal PWDWNT is activated (e.g. at a high level), the first VEQ generator 105 sends 1.4V (or 0.7V) as a VEQ power supply for the sense amplifier 104. When the power down signal PWDWNT is inactivated, the second VEQ generator 106 sends a boosted voltage VPP as a VEQ power supply for the sense amplifier 104. Outputs of the first VEQ generator 105 and the second VEQ generator 106 are connected in common. When the power down signal PWDWNT is in the activated state and in the inactivated state, the output of the second VEQ generator 106 and the output of the first VEQ generator 105 are in the high impedance state, respectively.

Figure 4:
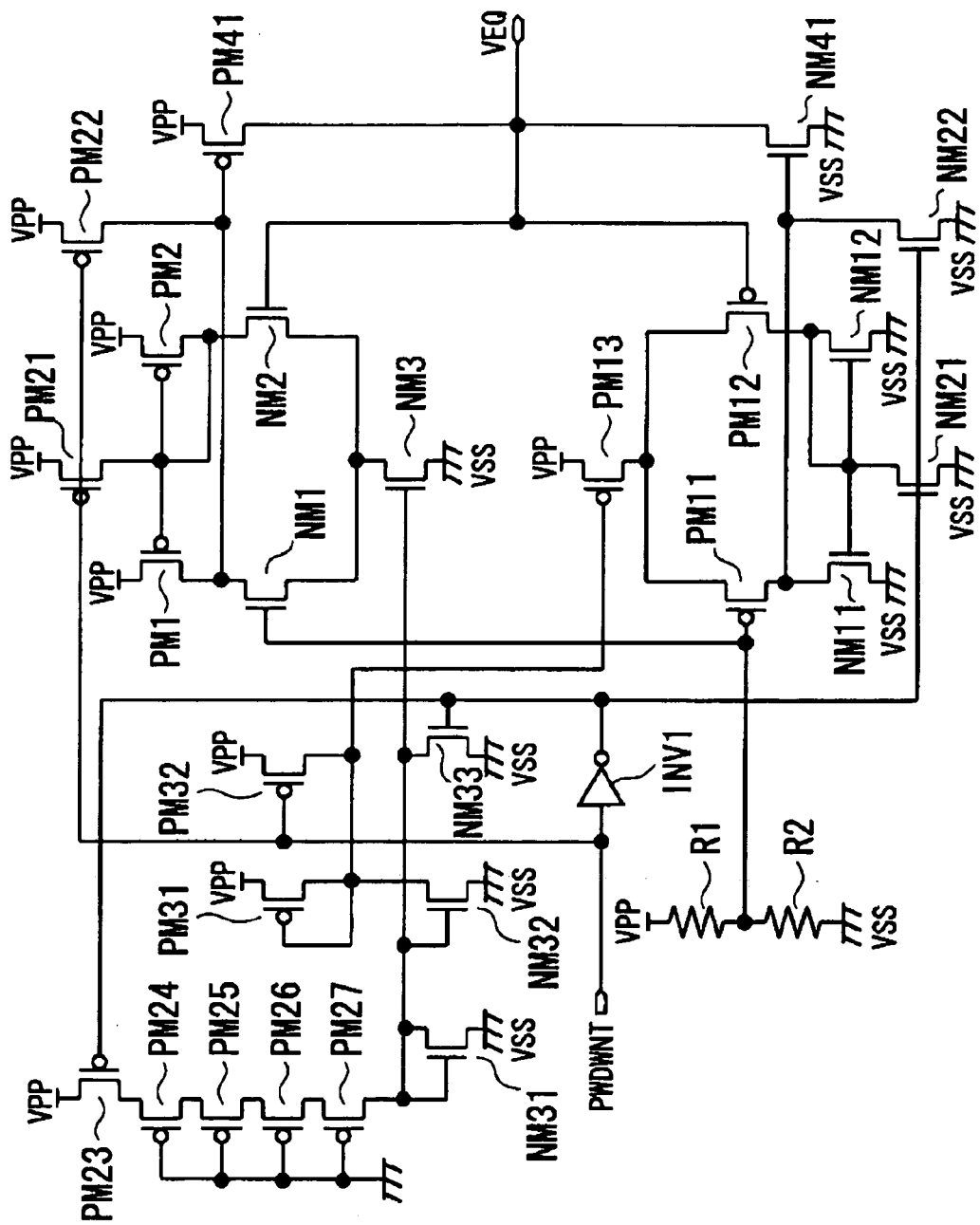
FIG. 4 shows an illustrative configuration of a first VEQ generator of FIG. 3.

FIG. 4 shows an exemplary configuration of the first VEQ generator 105. This circuit is formed by a differential amplifier circuit of the voltage follower configuration having its non-inverting input supplied with a voltage of e.g. 1.4V and having its output end connected in feedback fashion to its inverting input. This circuit is designed so that, when the power down signal PWDWNT is in the inactivated state, the output of the circuit is set to the high impedance state. Referring more specifically to FIG. 4, the circuit includes a first differential pair composed of NMOS transistors NM1 and NM2, having sourced connected in common and connected via a current source transistor NM3 to a power supply VSS, a first differential circuit composed of PMOS transistors PM1 and PM2 of a current mirror configuration, forming an active load of the first differential pair, a second differential pair composed of PMOS transistors PM11 and PM12, having sources connected in common and connected via a current source transistor PM13 to a power supply VPP, a second differential circuit composed of NMOS transistors NM11 and NM12 of a current mirror configuration, forming an active load of the second differential pair, and resistors R1, R2 connected in series across the power supply VPP and the power supply VSS. In the embodiment of FIG. 1, the divided voltage by the resistors R1, R2 is 1.4V.

The gate of the NMOS transistor NM1 (non-inverting input of the first differential circuit) and the gate of the PMOS transistor PM11 (non-inverting input of the second differential circuit) are connected in common and connected to a junction of the resistors R1 and R2. The gate of the NMOS transistor NM2 (inverting input of the first differential circuit) and the gate of the PMOS transistor PM12 (inverting input of the second differential circuit) are connected in common and connected to an output terminal VEQ.

An NMOS transistor PM21 is connected across the power supply VPP and the common connected gates of the PMOS transistors PM1 and PM2, forming the active load of the first differential circuit, whilst an NMOS transistor NM21 is connected across the power supply VSS and the common connected gates of the NMOS transistors NM11 and NM12, forming the active load of the second differential circuit.

A PMOS transistor PM41 is connected across the power supply (boosted potential) VPP and the output terminal VEQ, whilst an NMOS transistor NM41 is connected across the output terminal VEQ and the power supply VSS. These transistors make up output stage transistors. Each one capacitor device may be provided across the output terminal VEQ and the gate of the transistor PM41 and across the output terminal VEQ and the gate of the transistor NM41.

The drain of the NMOS transistor NM1 is connected to the gate of the PMOS transistor PM41, while the drain of the PMOS transistor PM11 is connected to the gate of the NMOS transistor NM41. A PMOS transistor PM22 is connected across the gate of the PMOS transistor PM41 and VPP, whilst an NMOS transistor NM22 is connected across the gate of the NMOS transistor NM41 and VSS.

The power down signal PWDWNT is connected in common to the gates of the PMOS transistors PM21 and PM22, whilst a signal corresponding to an inverted version of the power down signal PWDWNT by an inverter INV1 is input common to the gates of the NMOS transistors NM21, NM22.

There are also provided PMOS transistors PM24, PM25, PM26 and PM27 in four tiers, having gates connected in common to the power supply VSS. A PMOS transistor PM23 is connected across the power supply VPP and the source of the PMOS transistor PM24. The gate of the PMOS transistor PM23 is connected to an output of the inverter INV1. An NMOS transistor NM31, connected in a diode configuration, is connected to the drain of the PMOS transistor PM27. A junction of the drain and the gate of the NMOS transistor NM31 is connected to the gate of the NMOS transistor NM3 and to the gate of the NMOS transistor NM32 having its source grounded. The drain of the NMOS transistor NM32 is connected to the gate and the drain of the PMOS transistor PM31, connected in a diode configuration and having its source connected to the power supply VPP.

An NMOS transistor NM33, having its gate connected to an output of the inverter INV1, is connected across the power supply VSS and the gate of the NMOS transistor NM3, operating as a current source for the first differential circuit. A PMOS transistor PM32, having its gate connected to PWNDNT, is connected across the power supply VPP and the gate of the PMOS transistor NM13, operating as a current source for the second differential circuit.

The operation of the circuit shown in FIG. 4 is now explained. With the power down signal PWDWNT in the low level, the NMOS transistor NM33 is turned on, while the NMOS transistor NM3, supplying the tail current of the first differential pair, is turned off. The PMOS transistor PM32 is turned on, while the PMOS transistor PM13, supplying the tail current of the second differential pair, is turned off. The PMOS transistor PM21 is turned on. The potential of the gates, connected in common, of the PMOS transistors PM1, PM2, forming a load circuit for the first differential pair, is VPP, so that the PMOS transistors PM1 and PM2 are turned off. The NMOS transistor NM21 is turned on, and the potential of the gates, connected in common, of the NMOS transistors NM11 and NM12, forming a load circuit for the second differential pair, is set to VSS, so that the NMOS transistors NM11, NM12 are turned off. The PMOS transistor PM22 is turned on to turn off the PMOS transistor PM41 of the output stage. Hence, current paths of the first and second differential circuits are broken and turned off, with the output amplifier stage (PM41 and NM41) being turned off.

On the other hand, with the power down signal PWDWNT in the high level, the NMOS transistor NM33 is turned off, the PMOS transistor PM23 is turned on, and the potential of the junction of the five stages stacked transistors PM23 to PM27 and the diode-connected NMOS transistor NM31 (in the on-state) is supplied as a bias voltage to the gate of the NMOS transistor NM3. The PMOS transistors PM21 and PM22 are turned off to activate the first differential circuit. On the other hand, the PMOS transistor PM32 is turned off and the potential of the junction of the drain of the NMOS transistor NM32 in the on-state and the drain of the diode-connected transistor PM31 is supplied as the bias voltage to the gate of the PMOS transistor PM13. The NMOS transistors NM21, NM22 are turned off to activate the second differential circuit.

An output of the first differential circuit is supplied to the gate of the PMOS transistor PM41 of the output stage, and an output of the second differential circuit is supplied to the gate of the NMOS transistor NM41 of the output stage, whilst the voltage supplied to non-inverting inputs of the first and second differential circuits (VPP×R2/(R1+R2)) is output at the output terminal VEQ.

Figure 5:
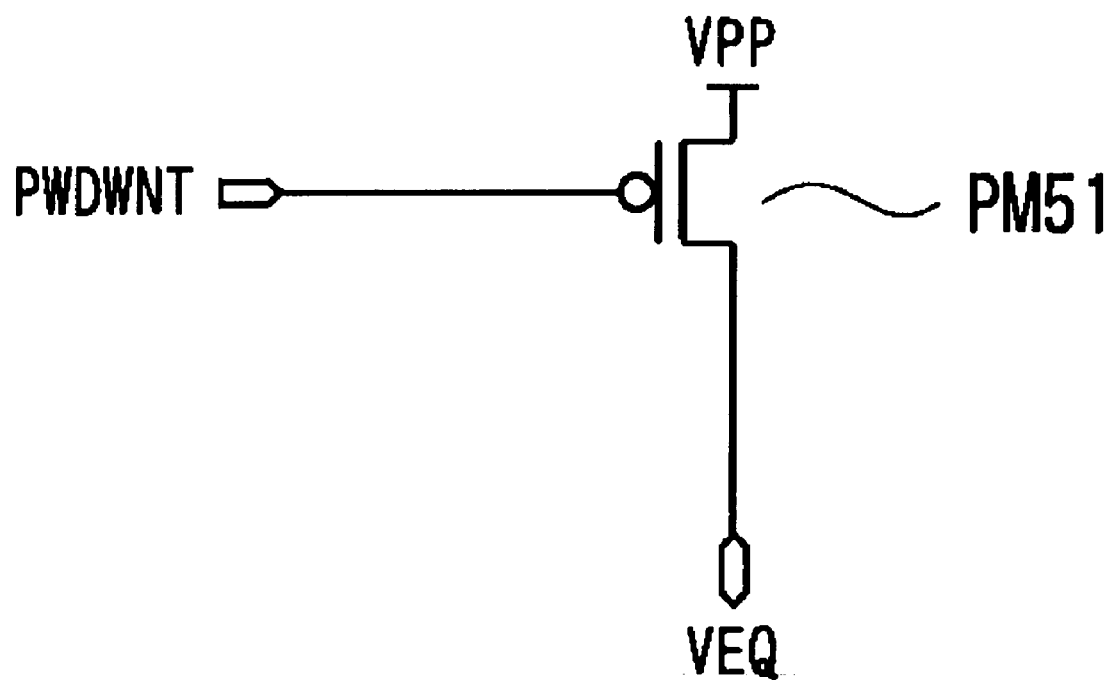
FIG. 5 shows an illustrative configuration of a second VEQ generator of FIG. 3.

FIG. 5 shows an exemplary configuration of the second VEQ generator 106. Referring to FIG. 5, the second VEQ generator 106 is made up by a PMOS transistor PM51, having a source and a drain connected to VPP and to the output terminal VEQ, respectively, and having a gate supplied with PWDWNT. With PWDWNT at a high level, the PMOS transistor PM51 is set to be in an off state. With PWDWNT at a low level, the PMOS transistor PM51 is turned on to output VPP (3.2V) at VEQ.

Referring again to FIG. 3, the second VEQ generator 106 is arranged at a position closer to the sense amplifier 104 than is the first VEQ generator 105. In restoration from the power down state, the VEQ needs to transfer quickly from 1.4V to 3.2V. For this reason, the second VEQ generator 106 is arranged at a position proximate to the sense amplifier 104 in consideration of the interconnection load capacitor. The VEQ is the VPP (boosted potential) during the time other than the low power time. A large number of the boosted potentials VPP are used as the PMOS substrate potential in the vicinity of the memory cell array, such as the boosted voltage on the word line of the memory cell array. By capacitive coupling of VEQ to the VPP load in the vicinity of the array, the VPP side capacitor $C_{VPP}$ is appreciably larger than the VEQ side capacitor $C_{VEQ}$, so that VEQ may quickly be restored to the VPP potential.

Figure 6:
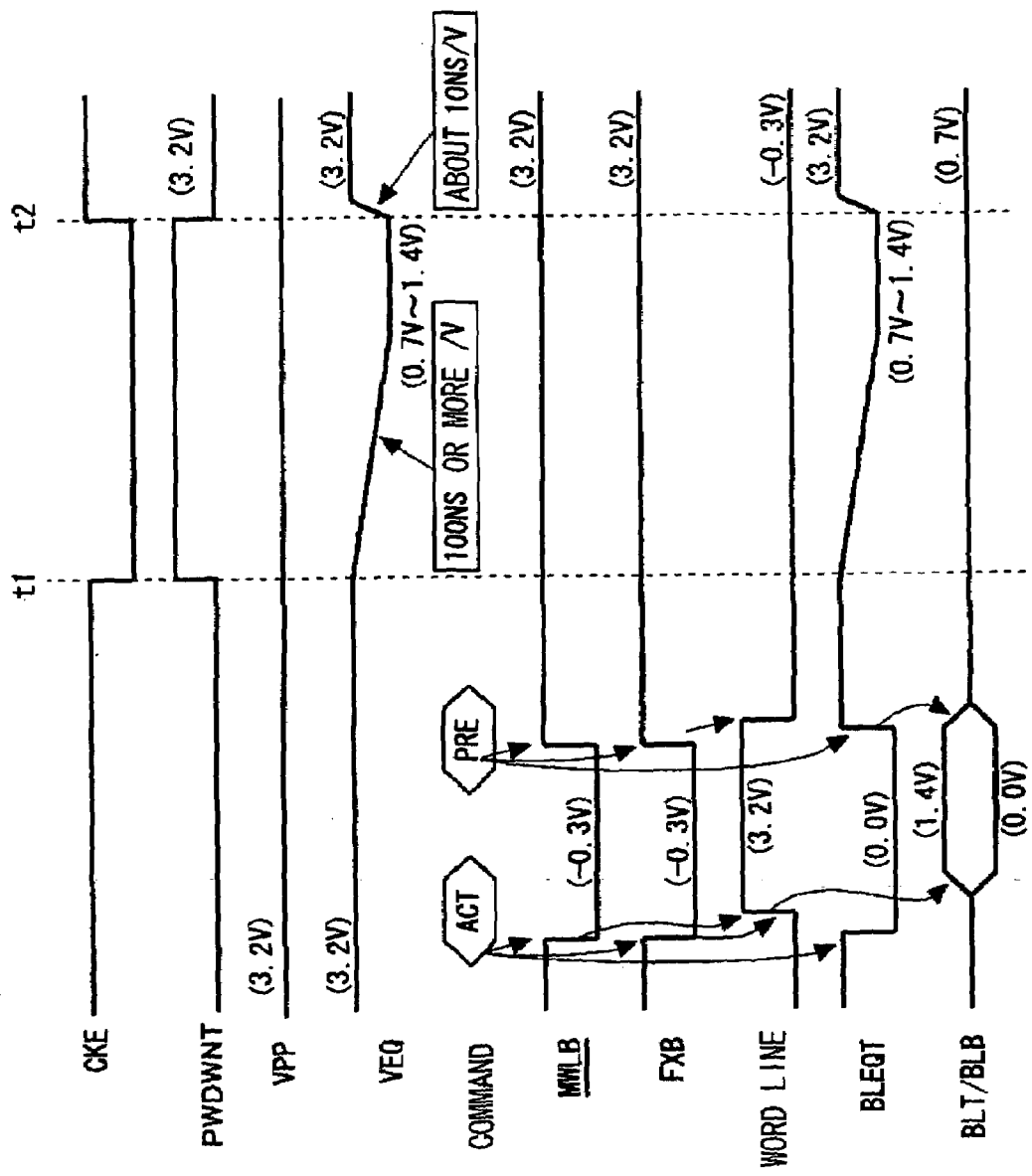
FIG. 6 is a timing waveform diagram for illustrating the operation of an embodiment of the present invention.

FIG. 6 is a timing chart showing an example of the operation of the present embodiment. Referring to FIG. 6, the clock enable signal CKE is low during the time as from a time point t1 until a time point t2. During this time, the power down signal PWDWNT is at a high level, with the semiconductor storage device being in the low power (power down) mode. Before the time point t1, the semiconductor storage device is supplied with an active (ACT) command input and with a row address and then with e.g. a read (READ) command and a column address. The main word line and a sub-word selection line are activated (FXT being VPP), so that the selected word line is activated. The BLEQT is at a low level. The bit line at the precharge potential is amplified by the amplifier circuit 4 (see FIG. 1) to enlarge the differential potential of the bit line pair BLT and BLB to output the resulting differential potential as readout data. The precharge command (PRE) then is input, BLEQT is at a high level (3.2V), and the bit like pair BLT and BLB are precharged to the precharge potential of 0.7V.

At the next time point t1, the clock enable signal CKE is at a low level, whilst the power down signal PWDWNT goes high at the time point t1 in synchronism with the clock enable signal CKE. With the power down signal PWDWNT at the high level, the output of the second VEQ generator 106 of FIG. 3 is set to be in an off state. As the VEQ, an output potential of the first VEQ generator 105 is supplied, and hence the VEQ potential is set from a voltage of 3.2V to a voltage from 0.7 to 1.4V.

At the next time point t2, the clock enable signal CKE undergoes transition from the low level to the high level. With this transition, the power down signal PWDWNT undergoes transition from the high level to the low level. The output of the first VEQ generator 105 is in the high impedance state. The output terminal VEQ is supplied with an output voltage from the second VEQ generator 106 and is set from the level of 0.7 to 1.4V to a level of 3.2V.

Referring to FIG. 6, the slew rate of decay of VEQ from 3.2 to 1.4, based on decay transition of the clock enable signal CKE, is set to e.g. 100N/V (100 NS per 1V drop), whilst the slew rate of rise of VEQ from 1.4 to 3.2, based on rising transition of the clock enable signal CKE, is set to e.g. 10N/V (10 NS per 1V drop). The change in the VEQ potential from the normal operating mode to the low power mode is made to occur over a sufficiently long time in order to take account of such a case where the clock enable signal CKE is once set to a low level and is instantly restored to the high level. Conversely, the change of the VEQ potential from the usual operating mode to the low power mode is made to occur quickly.

Figure 7:
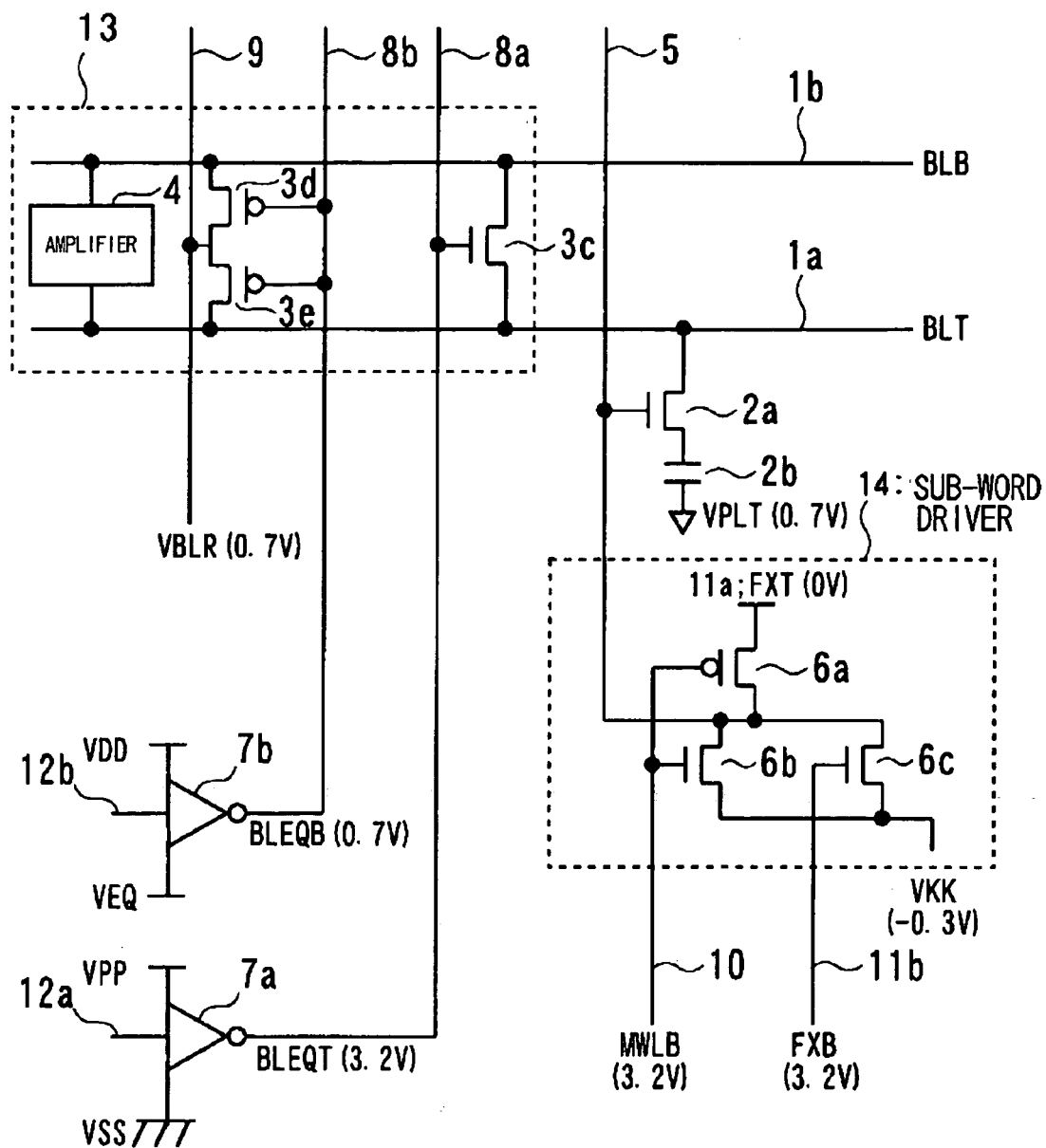
FIG. 7 shows a configuration of another embodiment of the present invention.

FIG. 7 shows the configuration of the second embodiment of the present invention, and specifically depicts the state at the time of low power operation. The present embodiment differs from the previous embodiment, shown in FIG. 1, as to the configuration of the precharge equalizing circuit. In the embodiment, shown in FIG. 1, the transistors 3a to 3c, forming the precharge equalizing circuit, are all formed by NMOS transistors. In the present embodiment, the equalizing transistor 3c is formed by an NMOS transistor, whilst the precharge circuit is formed by PMOS transistors 3d, 3e. A precharge equalized control signal line (BLEQT) 8a, connected to the gate of the equalizing NMOS transistor 3c, is driven by a driver 7a, whilst a precharge equalizing control signal line (BLEQT) 8b, connected to the gates of the precharging PMOS transistors 3d and 3e, is driven by a driver 7b.

The driver 7a is made up by a CMOS inverter circuit, connected across the high potential (boosted potential) VPP and the low side power supply potential (ground potential) VSS, and is supplied with a control signal 12a. When the control signal 12a is in the activated state (low level), the driver 7a drives the precharge equalizing control signal line (BLEQT) 8a to the high potential VPP and, when the control signal 12a is in the inactivated state (high level), the driver 7a drives the precharge equalizing control signal line (BLEQT) 8a to the ground potential VSS.

The driver 7b is made up by a CMOS inverter circuit, having high side and low side power supply terminals coupled to a power supply potential VDD and to a potential VEQ, and is supplied with a control signal 12b. When the control signal 12b is in the inactivated state (low level), the driver drives the precharge equalizing control signal line (BLEQT) 8b to the power supply potential VDD and, when the control signal 12b is in the inactivated state (high level), the driver drives the precharge equalizing control signal line (BLEQT) 8b to the low side potential VEQ. The control signals 12a and 12b are complementary level signals and may simultaneously be set to the activated state and to the inactivated state. That is, the transistors 3d, 3e and 3c are controlled on/off simultaneously.

In an example shown in FIG. 7, the control signal 12a is in the activated state (low level), whilst the control signal 12b is in the activated state (high level). The precharge equalized control signal line (BLEQT) 8a is at a high potential VPP, whilst the precharge equalizing control signal line (BLEQT) 8b is at the potential VEQ. With the power down signal PWDWNT in a high level, the first VEQ generator 105 (see FIG. 3) outputs 0.7V from the output terminal VEQ and, with the power down signal PWDWNT in a low level, the first VEQ generator 105 is set to be in an off state. On the other hand, the second VEQ generator 106 (see FIG. 3) sets the output VEQ potential to VSS (0V) during the time other than the low power time. At the time of low power operation, the second VEQ generator 106 is set to be in an off state.

Figure 8:
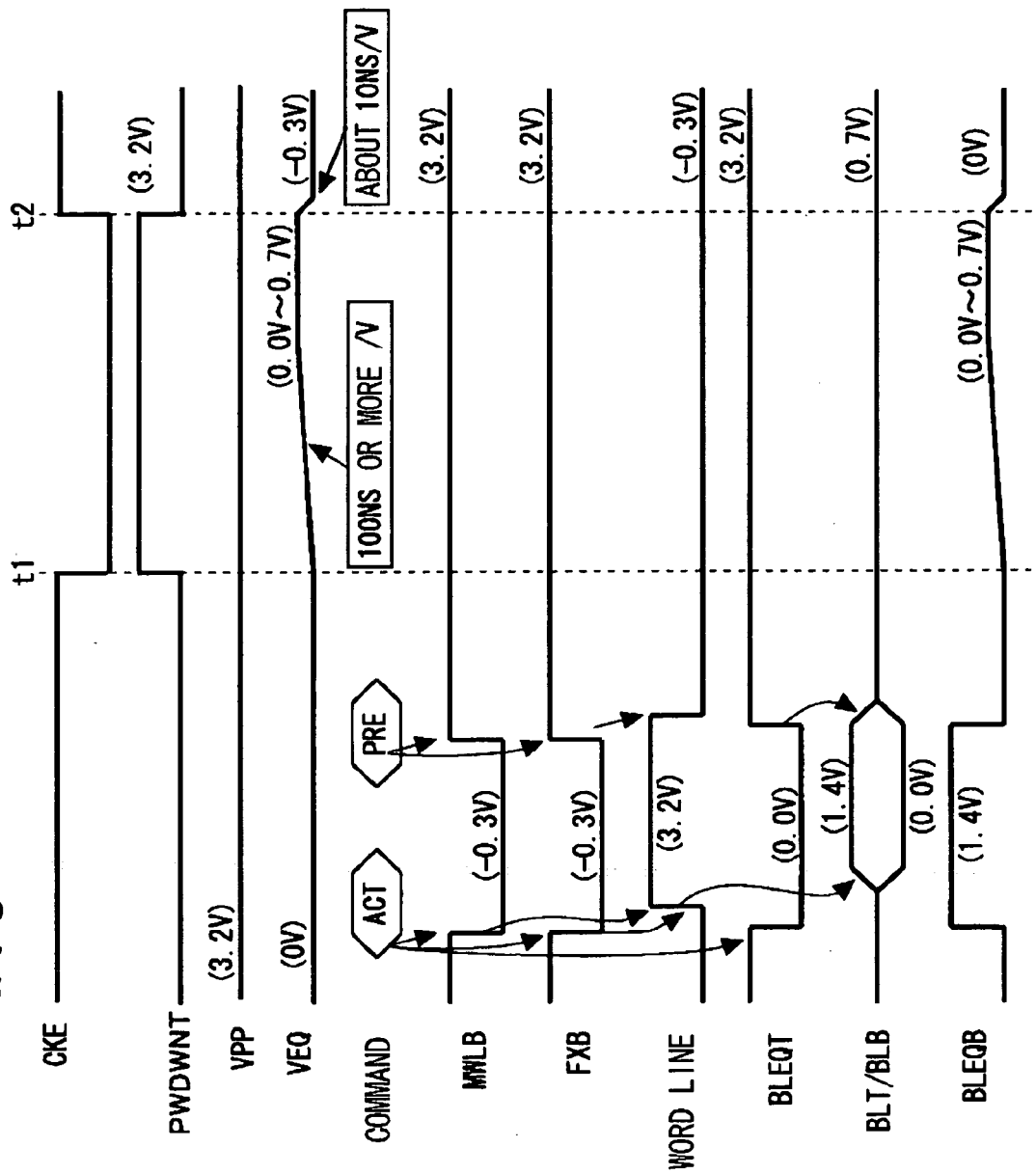
FIG. 8 is a timing waveform diagram for illustrating the operation of the other embodiment.

FIG. 8 shows an exemplary operation of the second embodiment of the present invention. The following are the points of difference of the timing waveform diagram of FIG. 8 from that of FIG. 6:

(1) At the time point t1, the clock enable signal CKE is at a low level. The power down signal PWDWNT goes high at the time point t1, in synchronism with the clock enable signal CKE. The output of the second VEQ generator 106 (see FIG. 3) is off. The output potential from the first VEQ generator 105 is supplied as the VEQ potential of the driver 7b. The VEQ potential is set from 0V (ground potential) to 0.7V.

(2) At the time point t2, the clock enable signal CKE undergoes transition from the low level to the high level. The power down signal PWDWNT undergoes transition from the high level to the low level. An output of the first VEQ generator 105 is set to a high impedance state, and a voltage from the second VEQ generator 106 (see FIG. 3) is supplied as a VEQ potential for the driver 7b, which potential is thereby set to from 0.7V to 0V.

Referring to FIG. 8, the slew rate of rising from 0.0V to 0.7V of the VEQ potential, based on the decay of the clock enable signal CKE, is set to e.g. 100 N/V (100 NS per rise of 1V), whilst the slew rate of decay from 0.7V to 0.0V of the VEQ potential, based on the rise of the clock enable signal CKE, is set to e.g. 10 N/V (10 NS per rise of 1V). The change in the VEQ potential from the normal operating mode to the low power mode is made to occur over a sufficiently long time in order to take account of such a case where the clock enable signal CKE is once set to a low level and is instantly restored to the high level. Conversely, the change of the VEQ potential from the low power mode to the normal operating mode is made to occur quickly.

In the present embodiment, two precharge equalizing control signal lines 8, namely 8a and 8b, are used. The number of the driver circuit is increased by one (7a, 7b) as compared to that of the above embodiment shown in FIG. 1. However, since the driver circuits 7a and 7b are used in common for plural bit line pairs, as is the sub-word driver 14, the number of devices is not increased as compared to that in the embodiment shown in FIG. 1. The present embodiment, however, differs from the embodiment shown in FIG. 1 in the following respects, as now explained with reference to FIG. 9.

Figure 9A:
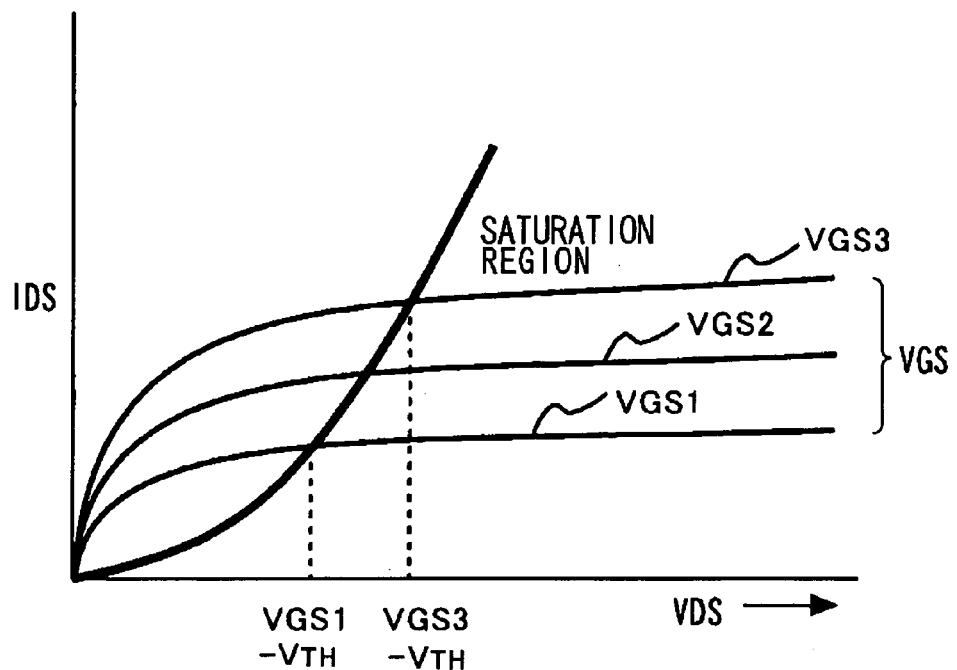
FIG. 9A illustrates an operating characteristic of a precharge transistor according to a first embodiment of the present invention.

With the embodiment shown in FIG. 1 (first embodiment), if the bit line potential is lowered due to shorting across the bit and word lines, due to crossing failure, the gate-to-source potential VGS of the transistor 3b is changed, while the potential VDS across its drain and source is also increased. The drain to source current IDS is as shown in FIG. 9A. When the gate to source potential VGS is increased from VGS1 to VGS3, the drain to source current IDS is increased from $(VGS1-VTH)^2$ to $(VGS3-VTH)^2$, according to a square rule, with the leakage current also being increased.

Figure 9B:
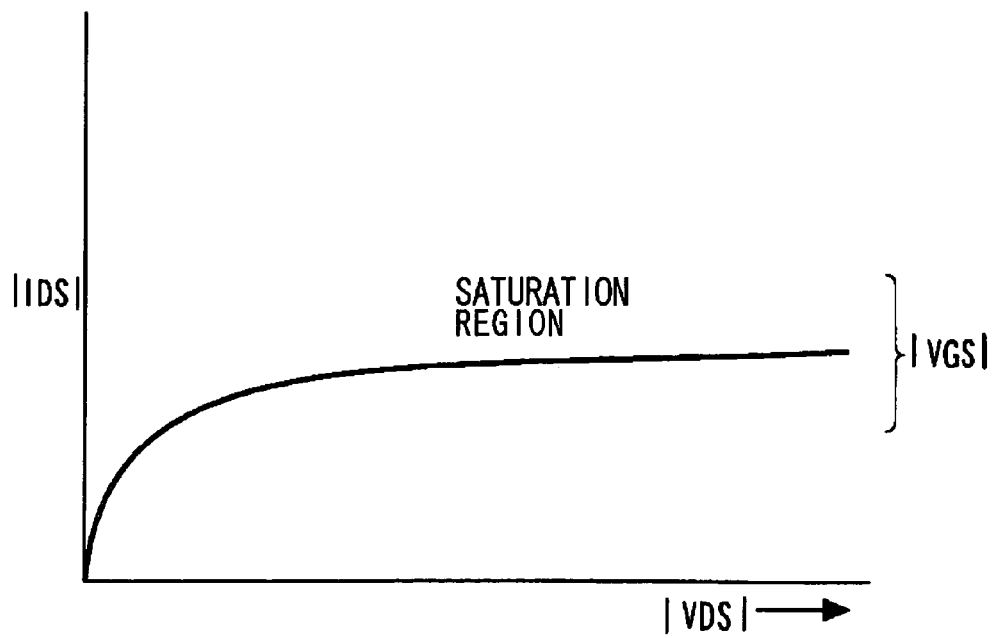
FIG. 9B illustrates an operating characteristic of a precharge transistor according to a second embodiment of the present invention.
Figure 11:
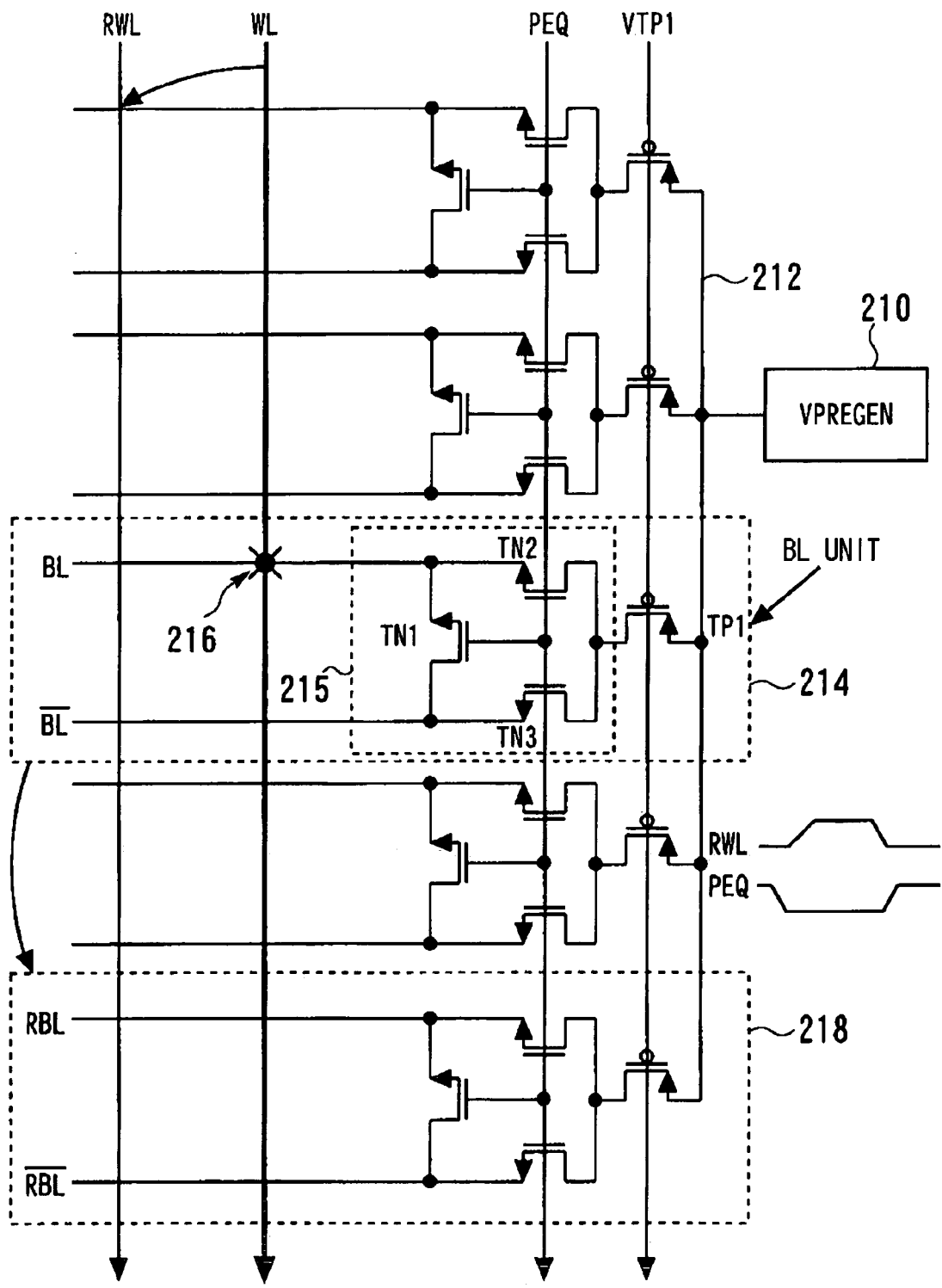
FIG. 11 shows a configuration of a conventional semiconductor storage device.

On the other hand, the embodiment shown in FIG. 7 (second embodiment) uses PMOS transistors 3d and 3e as a precharging circuit. If, due to e.g. crossing failure, the potential on the bit line is lowered, the gate-to-source voltage (absolute value) |VGS| is constant. If, as shown in FIG. 9B, the drain-to-source voltage |VDS| is increased, drain-to-source current (absolute value) |IDS| is approximately constant (saturation region) to suppress the leakage current from increasing.

As a modification of the embodiment, shown in FIG. 7, the equalizing NMOS transistor 3c may, of course, be formed by a PMOS transistor. In this case, the gate of the PMOS transistor is supplied with a signal from the driver 7b.

The semiconductor storage devices of the above-described embodiments, in which the leakage current across the bit and word lines at the time of low power operation is decreased to reduce the standby current, may conveniently be used for a variety of electronic equipment, such as, above all, mobile information terminals or mobile wireless terminals. Although the present invention has so far been explained in connection with a clock-synchronized dynamic semiconductor storage device, which has made marked progress in integration degree and in operating speed, the present invention is not limited to the configuration of the above-described embodiments, but may comprise various changes and corrections that may be achieved by those skilled in the art within the scope of the invention as defined in the claims.

For example, the present invention is not limited to the dynamic semiconductor storage device, but may be applied to semiconductor storage devices of optional configurations, in which bit lines are precharged, such as a static semiconductor storage device.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
   a memory cell array including a plurality of bit lines, extending in one direction, a plurality of word lines, extending in a direction perpendicular to said bit lines, and a plurality of memory cells arranged at points of intersection of said bit lines ands said word lines;
   an active element inserted across a precharge power supply line for supplying the precharging potential to said bit lines, said active element precharging said bit lines responsive to a control signal supplied to a control terminal thereof; and
   a circuit for performing control so as to supply to said control terminal of said active element at the time of low power operation a preset potential changed from the potential applied to said control terminal at the time of precharging in normal operation;
   whereby the leakage current caused by shorting across said bit line and the word line is limited at the time of low power operation.

2. The semiconductor storage device according to claim 1, further comprising:
   a circuit for generating a signal controlling the setting/release of the low power operation based on at least one signal entered to an external terminal of the semiconductor storage device; and
   a circuit for performing switching control for supplying said preset potential different from the potential applied to said control terminal at the time of precharging in normal operation;
   the potential applied to said control terminal of said active element at the time of precharging in normal operation being a potential sufficient to turn on said active element.

3. The semiconductor storage device according to claim 1, wherein
   said active element is a transistor of a first conductivity type; and wherein
   the control terminal of said transistor is set to a potential lower than a first potential applied to said control terminal at the time of precharging in normal operation.

4. The semiconductor storage device according to claim 3, wherein
   said preset potential as set on said control terminal of said transistor at the time of low power operation is not larger than one-half of said first potential.

5. The semiconductor storage device according to claim 4, wherein
   said preset potential as set on said control terminal of said transistor at the time of low power operation is not less than said precharge potential.

6. The semiconductor storage device according to claim 1, wherein
   said active element is a transistor of a second conductivity type; and; wherein
   the control terminal of said transistor is set to a potential higher than a second potential applied to said control terminal at the time of precharging in normal operation.

7. The semiconductor storage device according to claim 6, wherein
   said preset potential as set on said control terminal of said transistor at the time of low power operation is not larger than said precharge potential.

8. The semiconductor storage device according to claim 1, further comprising:
   a bit line pair made up by a first bit line and a second bit line;
   a precharge equalizing circuit including first and second MOS transistors of the first conductivity type, having one of source and drain connected to said bit line pair, and having others of the sources and the drains connected in common, with the junction of the common connection being connected to said precharge power supply line, and a third MOS transistor of the first conductivity type, having a source and a drain connected to said bit line pair, with gates of the first to third MOS transistors being connected in common to a control signal line; and
   a driver circuit supplying an input signal to an input end and having an output end connected to said control signal line;
   said driver circuit receiving a first potential as a high side power supply potential during the normal operation and receiving said preset potential, lower than said first potential, as a high side power supply potential, at the time of the low power operation; said driver circuit setting said control signal line to said high side power supply potential when said input signal is activated.

9. The semiconductor storage device according to claim 8, further comprising:
   a first power supply control circuit including a voltage follower amplifier circuit activated at the time of low power operation, having an output set to be in an off state except during said low power operation, having a non-inverting input end supplied with said preset potential and having an output end thereof connected in feedback fashion to an inverting input end thereof; and
   a second power supply control circuit activated except during said low power operation to output said first potential; said second power supply control circuit having an output set to be in an off state at the time of low power operation;
   said first and second power supply control circuits having output ends connected in common; with a common junction of said output ends being connected to a power feed terminal of a high side power supply of said driver circuit.

10. The semiconductor storage device according to claim 1, further comprising:
    a bit line pair including a first bit line and a second bit line;
    a precharge equalizing circuit including first and second MOS transistors of the second conductivity type, having one of the sources and the drains connected to said bit line pair, and having the others of the sources and the drains connected in common, with the junction of the common connection being connected to said precharge power supply line, and a third MOS transistor of the first conductivity type, having a source and a drain connected to said bit line pair, with the gates of the first and second MOS transistors being connected in common to a first control signal line and with the gate of said third MOS transistor being connected to a second control signal line;
    a first driver circuit having an input end supplied with an input signal and having an output end connected to said first control signal line; and
    a second driver circuit having an input end supplied with said input signal and having an output end connected to said second control signal line;
    said first driver circuit receiving a first power supply potential as a high side power supply potential; said first driver circuit receiving a second power supply potential during the normal operation as a low side power supply potential; said first driver circuit receiving a preset potential higher than said second power supply potential at the time of low power operation; said first driver circuit setting said first control signal line to said low side power supply potential when said input signal is activated;

said second driver circuit receiving said first power supply potential and said second power supply potential as a high side power supply potential and as a low side power supply potential, respectively; said second driver circuit driving said second control signal line to said first power supply potential side when said input signal is activated.

11. The semiconductor storage device according to claim 10, further comprising:

a first power supply control circuit including a voltage follower amplifier circuit activated at the time of low power operation, having an output set to be in an off state except during said low power operation, having a non-inverting input end supplied with said preset potential and having an output end thereof connected in feedback fashion to an inverting input end thereof; and a second power supply control circuit activated except during said low power operation to output said second power supply potential; said second power supply control circuit having an output set to be in an off state at the time of low power operation;

said first and second power supply control circuits having output ends connected in common; with a common junction of said output ends being connected to a power feed terminal of a low side power supply of said driver circuit.

12. The semiconductor storage device according to claim 8, wherein the time until the high side power supply potential of said driver circuit resets from said preset potential to said first potential, in case of restoration, with the low power state released, is set so as to be shorter than the time until the high side power supply potential of said driver circuit undergoes transition from said first potential to said preset voltage for low power setting.

13. The semiconductor storage device according to claim 10, wherein the time until the low side power supply potential of said first driver circuit resets from said preset potential to said second power supply potential, in case of restoration, with the low power state released, is set so as to be shorter than the time until the low side power supply potential of said first driver circuit undergoes transition from said second power supply potential to said preset voltage for low power setting.

14. The semiconductor storage device according to claim 9, wherein said second power supply control circuit is arranged so as to be closer to said memory cell array than is said first power supply control circuit.

15. The semiconductor storage device according to claim 3, wherein said first potential is set so as to be equal to a boosted voltage used as a potential driving the selected word line.

16. The semiconductor storage device according to claim 1, wherein each word line is not selected at the time of low power operation and is set to a reset potential.

17. The semiconductor storage device according to claim 6, wherein said second potential is the ground voltage.

18. An electronic apparatus including a semiconductor storage device as defined in claim 1 as a memory device.

* * * * *